(12) United States Patent  (10) Patent No.: US 6,940,314 B1
Bloker et al. (45) Date of Patent: Sep. 6, 2005

(54) DYNAMIC NODE KEEPER SYSTEM AND METHOD

(75) Inventors: Ray Bloker, San Jose, CA (US); Parag Gupta, San Jose, CA (US)

(73) Assignee: Transmeta Corporation, Santa Clara, CA (US)

( * ) Notice: Subject to any disclaimer, the term of this patent is extended or adjusted under 35 U.S.C. 154(b) by 10 days.

(21) Appl. No.: 10/334,264

(22) Filed: Dec. 31, 2002

(51) Int. Cl.$^7$ .......................................... H03K 19/096
(52) U.S. Cl. ...................................... 326/98; 326/121
(58) Field of Search ........................... 326/93, 95, 98, 326/121

(56) References Cited

U.S. PATENT DOCUMENTS 5,440,243 A * 8/1995 Lyon ........................ 326/33

2003/0001623 A1 * 1/2003 Alvandpour et al. ......... 326/98

OTHER PUBLICATIONS

Staslak et al., "WA 17.1 A 2$^{nd}$ Generation 440ps SOI 64b Adder", 2000 IEEE International Solid-State Circuits Conference, ISSCC 2000/SESSION 17/Logic And Systems/Paper WA17.1, pp. 288-289, Feb. 2000 .*

* cited by examiner

*Primary Examiner*—Daniel D. Chang
(74) *Attorney, Agent, or Firm*—Wagner, Murabito & Hao LLP

(57) ABSTRACT

The present invention system and method provides voltage level support for an output target signal (e.g., a dynamic node output signal) that "keeps" the output target signal at a particular voltage level with efficient suspension of the voltage level maintenance or support during an evaluation transition period (e.g., a read operation) of the output target signal.

20 Claims, 8 Drawing Sheets

US 6,940,314 B1

DYNAMIC NODE KEEPER SYSTEM AND METHOD

FIELD OF THE INVENTION

The present invention relates to the field of electrical circuits with dynamic nodes.

BACKGROUND OF THE INVENTION

Electronic devices and systems have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data, ideas and trends in most areas of business, science, education and entertainment. These electronic devices often include dynamic nodes. However, leakage current characteristics of dynamic nodes tend to cause their output signal voltage levels to drop at a relatively fast rate. It is usually desirable for the dynamic nodes to be able to maintain a voltage level without conflicting with intentional operational changes to the voltage level.

SUMMARY

The present invention system and method provides voltage level support for an output target signal (e.g., a dynamic node output signal) that "keeps" the output target signal at a particular voltage level with suspension of the voltage level maintenance or support during an intentional transition of the output target signal.

DRAWINGS

DETAILED DESCRIPTION

Reference will now be made in detail to preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

The present invention system and method provides voltage level support for an output target signal (e.g., a dynamic node output signal) that "keeps" the output target signal above or below a particular voltage level with efficient suspension of the voltage level maintenance or support during intentional transitions in the output target signal. For example, a present invention suspension keeper system and method can provide voltage level support for an output signal of a dynamic node associated with a memory cell with suspension of the support during intentional transitions in the memory cell output. In one embodiment of the present invention, the suspension of the voltage level maintenance is provided during an evaluation transition period (e.g., associated with a read operation) of the output target signal (e.g., data output on a bitline). In one exemplary implementation, a present invention suspension keeper system and method facilitates rapid and efficient operational evaluation of a dynamic node.

Figure 1:
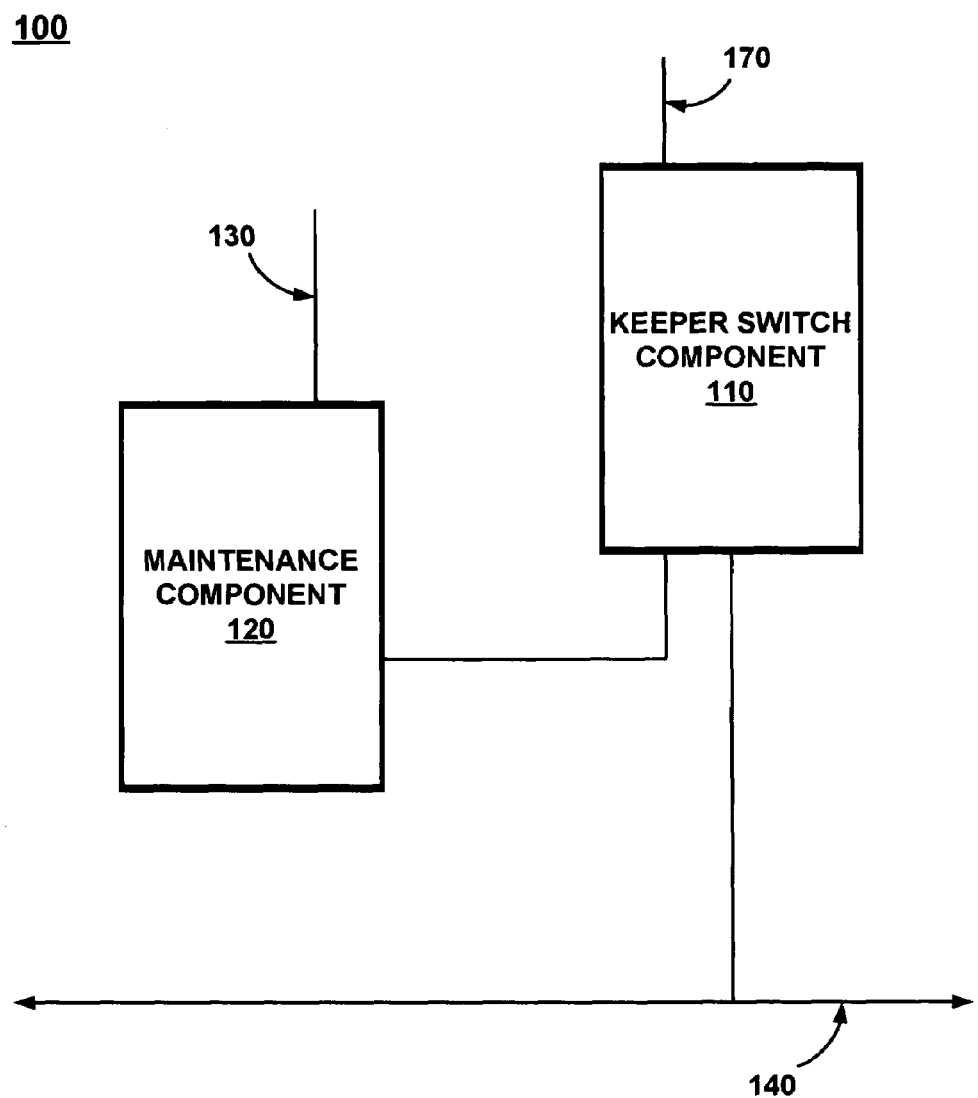
FIG. 1 is an illustration of a suspension keeper system in accordance with one embodiment of the present invention.

FIG. 1 is an illustration of suspension keeper system 100, a suspension keeper system in accordance with one embodiment of the present invention. Suspension keeper system 100 comprises keeper switch component 110 and keeper switch suspension component 120. Keeper switch component 110 is coupled to keeper switch suspension component 120 and to output target signal 140. In one embodiment of present invention, keeper switch suspension component 120 is coupled to suspension indication signal 130.

The components of suspension keeper system 100 cooperatively operate to provide maintenance of an output target signal 140 (e.g. a dynamic node output signal) voltage level and implements suspension of the voltage level maintenance during an evaluation transition period of the target signal 140. Keeper switch component 110 provides voltage level maintenance on target signal 140. Keeper switch suspension component 120 suspends the influence of the keeper switch component 110 on output target signal 140. In one embodiment of the present invention, keeper switch suspension component 120 suspends the influence of the keeper switch component 110 by controlling keeper switch component 110 and in an alternate embodiment keeper switch suspension component 120 suspends the influence of the keeper switch component 110 by blocking or passing the output of keeper switch component 110.

In one embodiment of the present invention, voltage level maintenance is suspended during an evaluation transition period of a target signal logic state (e.g., changing the voltage level of the output signal of a memory cell during a read operation). In one exemplary implementation of the present invention, a suspension indication signal 130 controls keeper switch suspension circuit 120. For example, when suspension signal 130 is asserted or activated keeper switch suspension circuit 120 suspends the influence of keeper switch component 110 on target signal 140. When suspension signal 130 is not asserted or deactivated keeper switch suspension circuit 120 does not interfere with the influence of keeper switch component 110 on target signal 140.

The present invention provides a convenient solution for problems associated with unintentional dynamic node output signal voltage level changes (e.g., associated with leakage currents) while permitting efficient intentional changes in a dynamic node output signal voltage level. In one embodiment, a dynamic node has one or more transistors (or stacks of series coupled transistors) which drive the node to a voltage level during an evaluation phase, and a single transistor which drives the node to another voltage level during a precharge phase. It is possible for both the evaluation transistors and the precharge transistor to be turned off and not driving the node. The dynamic node output target signal voltage level (e.g., associated with a logic state) can be maintained or supported by a present invention suspension keeper system and method. The suspension keeper system and method supply current to compensate for leakage current in transistors connected to the dynamic node target output signal, and thus maintain or "keep" the voltage level of the target output signal.

The present invention is readily adaptable to a variety of implementations. In one embodiment, a dynamic node can have multiple evaluation transistors, or stacks of transistors, connected in parallel, even though only one drives the dynamic node during an evaluation period (e.g., a read of a memory array bitline output). For example, multiple memory cells can be coupled to a bitline, and each cell can have an evaluation transistor that can drive the bitline to a logic state in an evaluation phase. A precharge transistor can be coupled to the bitline to drive the bitline to another logic state in the precharge phase. In one exemplary implementation of the present invention, increasingly larger transistors are utilized in the suspension keeper system and method to prevent leakage as more transistors are coupled to the dynamic node.

Figure 2A:
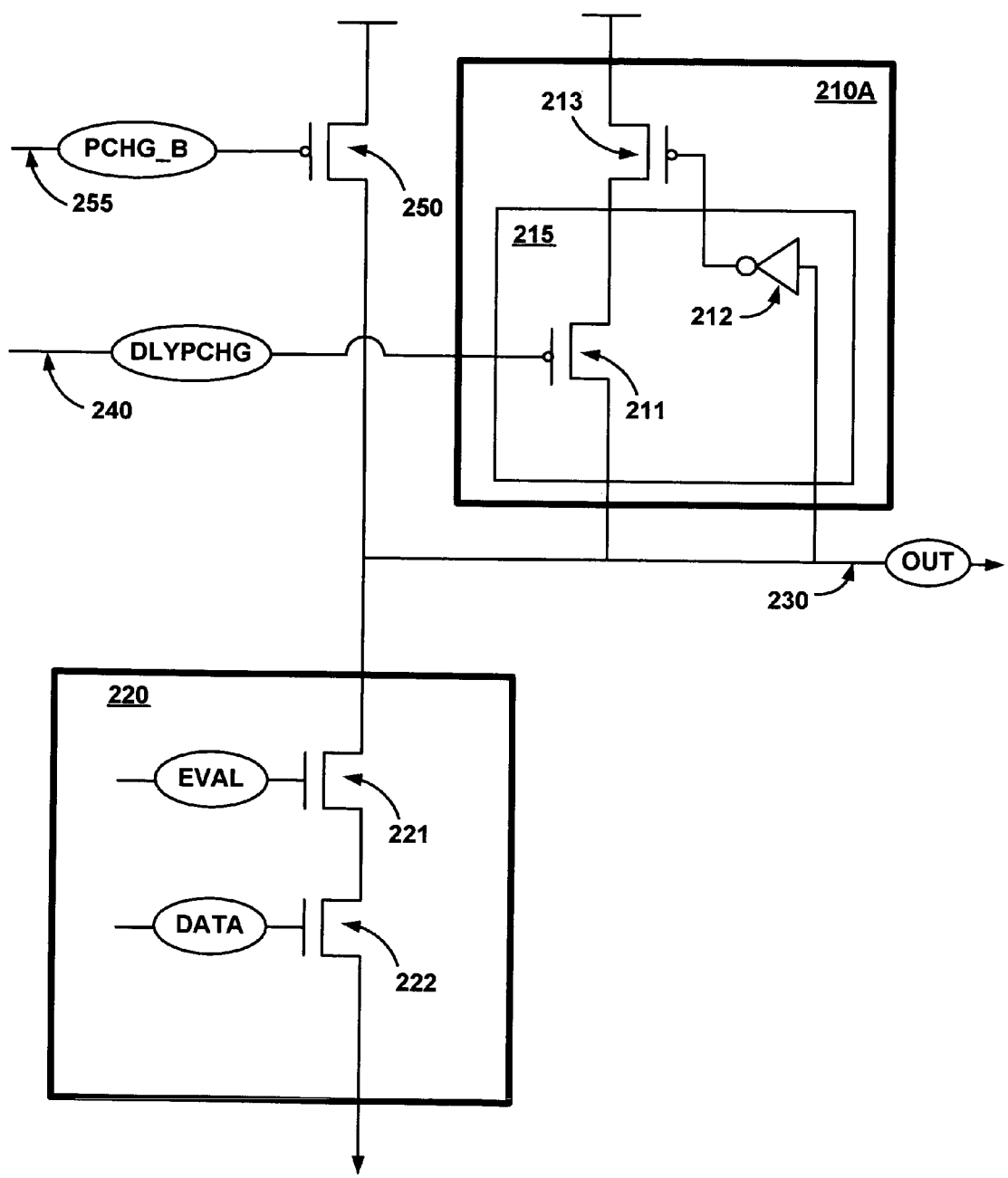
FIG. 2A is an illustration of one embodiment of a present invention suspension keeper circuit included in a memory array system.

FIG. 2A is an illustration of suspension keeper circuit 210A, one embodiment of a present invention suspension keeper circuit included in a memory array system 200A. Memory array system 200A comprises a suspension keeper circuit 210A, memory cell 220, a bit line 230 and precharge circuit 250. Bit line 230 is coupled to suspension keeper circuit 210A, memory cell 220, and precharge circuit 250. Precharge circuit 250 is coupled to precharge signal (PCHG-B) 255. Suspension keeper circuit 210A is coupled to suspension indication signal 240. In one embodiment of the present invention suspension indication signal 240 is a delayed inverted version signal (e.g., DLYPCHG) of precharge signal (PCHG-B) 255.

The components of memory array system 200A cooperatively operate to store digital information. Memory cell 220 stores a bit of information. Bit line 230 provides an indication of the logical state or value of the bit of information stored in memory cell 220. Suspension keeper circuit 210A maintains a first logical state of a said bit line 230 and suspends the maintenance during an evaluation transition period of memory cell 220 read operations. Precharge circuit 250 provides a precharge for memory cell 220.

In one embodiment, suspension keeper circuit 210A comprises keeper switch component 213 (e.g., a transistor) and keeper switch suspension component 215. In one exemplary implementation, keeper switch suspension component 215 includes inverter 212 and transistor 211. Inverter 212 is coupled to keeper switch component 213 and controls the operation of keeper switch component 213 based upon the logic state of bitline 230. If bitline 230 has a logical one state (e.g., a high voltage level) then inverter 212 turns transistor 213 on and if bitline 230 has a logical zero state (e.g., a low voltage level) then inverter 212 turns transistor 213 off. For example, inverter 212 is coupled to a control gate of a transistor included in keeper switch component 213 and determines whether keeper switch component 213 is on (e.g., permits electrical current to flow out of keeper switch component 213) or off (e.g., prevents current flow out of keeper switch component 213). Transistor 211 is coupled to the output of keeper switch component 213. Transistor 211 prevents or permits the output of keeper switch component 213 from influencing the voltage level of bit line 230 during an intentional change in the bit line logic state.

Without suspension keeper circuit 210A, leakage current in the transistors of memory cell 220 result in the bitline signal 230 going low and causing problems. For example, memory cell 220 can be storing a logical one value but the output bitline signal goes low and provides a false indication that memory cell 220 is storing a logical zero value. Suspension keeper circuit 210A prevents bit line 230 from going low unless the bit line 230 is intentionally being pulled down. Thus, suspension keeper circuit 210A does not diminish performance (e.g., slow intentional changes to the logic state indication of the bitline) by continually maintaining the voltage level of bit line 230 during an intentional change (e.g., during an intentional changes associated with a read operation). For example, a read operation of a logical zero state is performed in which the bit line is intentionally pulled low by a memory cell, suspension keeper circuit operations that maintain a high value are suspended and thus do not "fight" or resist the intentional pull down of the bitline signal voltage level. Without the suspension, the keeper would oppose the intentional pull down by trying to pull the bit line high while the memory cells are pulling the bit line low. This would have detrimental affects similar to a short circuit, burn power and take longer for the bit line to pull low.

The present invention provides a method and system for disabling a keeper circuit output and suspending voltage level maintenance during intentional operational changes in a target output signal voltage level during an evaluation process. In one embodiment of the present invention, "keeper" or maintenance operations are deactivated or suspended during state change operations (e.g., a transition of a memory cell output during a read operation). If an operational change is made to overcome the keeper (e.g., a bit line is pulled low), the keeper remains deactivated, otherwise it is reactivated. For example, when the intentional state change operation is over, the keeper circuit is not activated if a bit line is pulled low. In the case where a bit line is not pulled down, the keeper is activated.

Figure 2B:
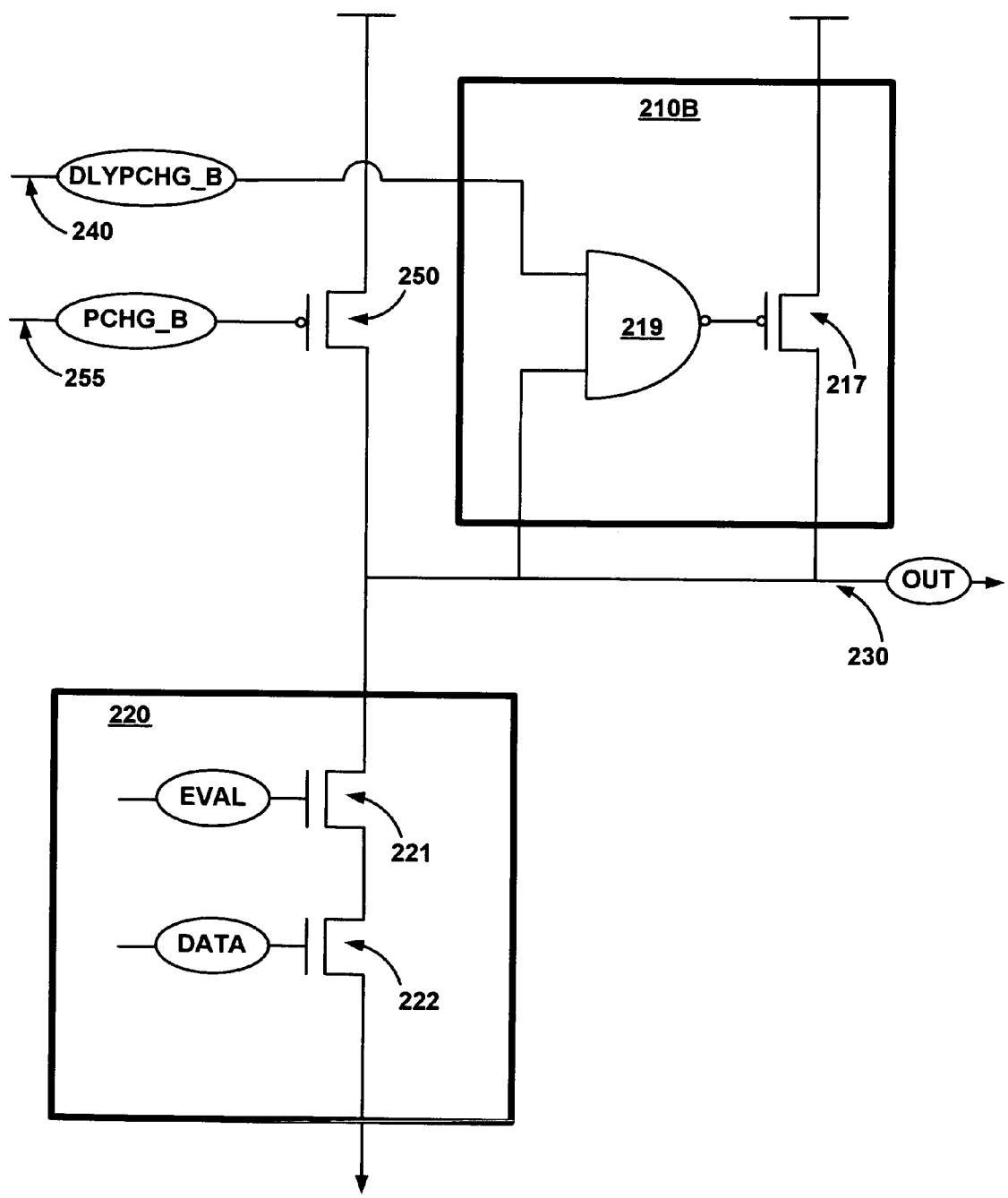
FIG. 2B is an illustration of an alternate embodiment of a present invention suspension keeper circuit included in a memory array system.

There are various different embodiments of a present invention suspension keeper circuits or the present invention. For example, FIG. 2B is an illustration of suspension keeper circuit 210B, an alternate embodiment of a present invention suspension keeper circuit included in a memory array system 200B. Memory array system 200B is similar to memory array system 200A except suspension keeper circuit 210B has a different configuration than suspension keeper circuit 210A. Memory array system 200B also comprises memory cell 220, a bit line 230 and precharge circuit 250. Bit line 230 is coupled to suspension keeper circuit 210B, memory cell 220, and precharge circuit 250. Precharge circuit 250 is coupled to precharge signal (PCHG-B) 255. Suspension keeper circuit 210B is coupled to suspension indication signal 240.

In one embodiment suspension keeper circuit 210B comprises keeper switch component 217 (e.g., a transistor) and keeper switch suspension component 219. Keeper switch suspension component 219 comprises a NAND gate. Keeper switch suspension component 219 is coupled to keeper switch component 213 and controls the operation of keeper switch component 217 based upon the logic state of bitline 230 and logical state of suspension indication signal 240. If suspension indication signal 240 is activated (e.g., low) then keeper switch suspension component 219 turns keeper switch component 217 off. If suspension indication signal 240 is deactivated (e.g., high) and bitline 230 has a logical one state then keeper switch suspension component 219 turns transistor 217 on. If suspension indication signal 240 is deactivated (e.g., high) and if bitline 230 has a logical zero state (e.g., a low voltage level) then keeper switch suspension component 219 turns transistor 217 off.

Figure 3A:
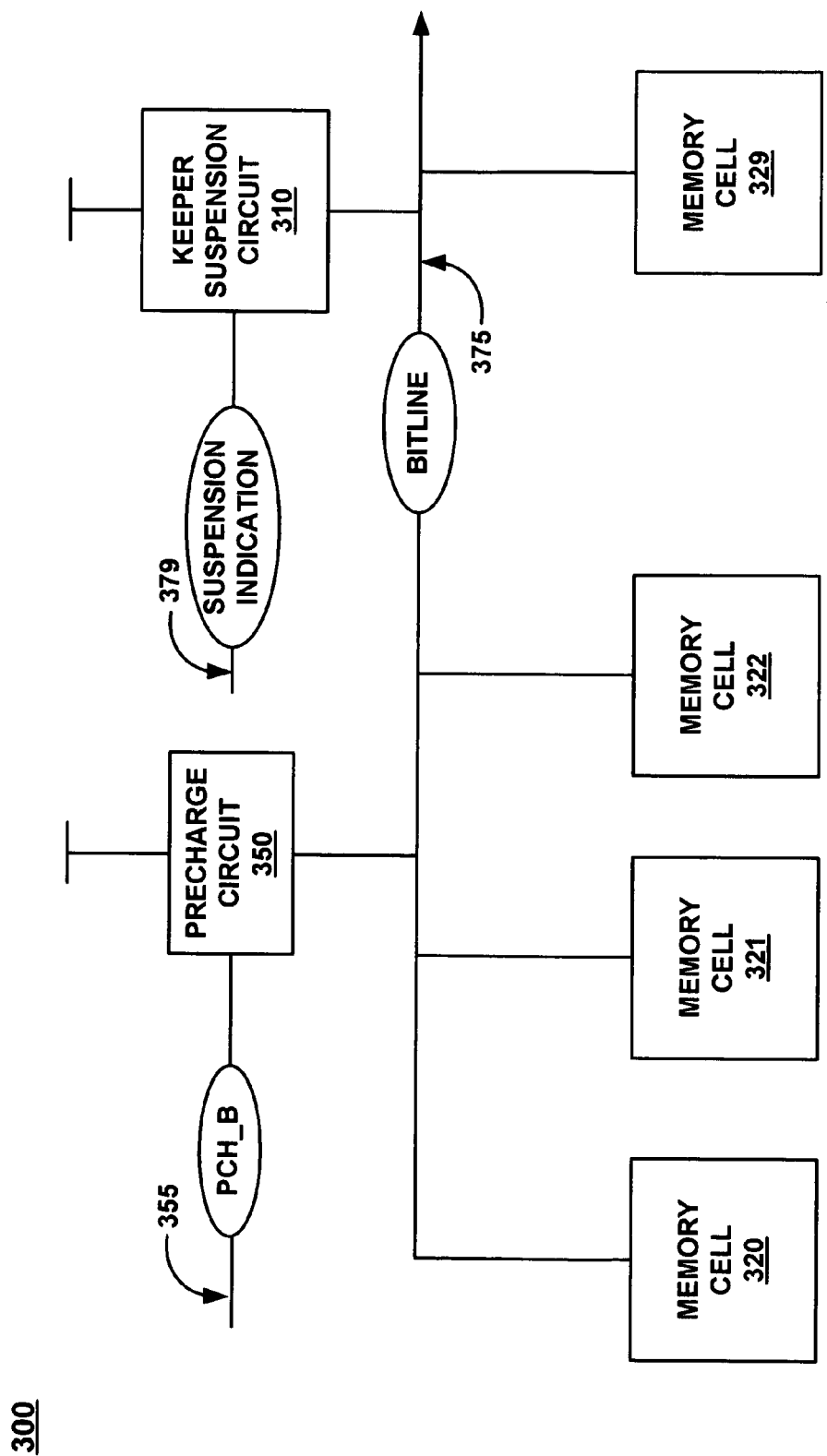
FIG. 3A is an illustration of a memory array in accordance with the present invention.

FIG. 3A is an illustration of memory array 300, one embodiment of a memory array in accordance with the present invention. Memory array 300 comprises memory cells 320 through memory cell 329, bitline 375, precharge circuit 350, and suspension keeper circuit 310. Memory cell 320 through memory cell 329 are coupled to bitline 375 which is coupled to precharge circuit 350 and suspension keeper circuit 310. Memory cells 320 through memory cell 329 store bits of information. Bitline 375 communicates a target output signal (e.g., a data signal) of memory cells 320 through 329. Precharge circuit 350 precharges bitline 375. Suspension keeper circuit 310 maintains a fist logical state (e.g., voltage level) of a said bit line 375 and suspends the maintenance of the first logic state during an evaluation transition period of memory cell 320 through 329 read operations. In one exemplary implementation, suspension keeper circuit 310 suspends the maintenance of the first logic state in response to a suspension indication signal 479.

Figure 3B:
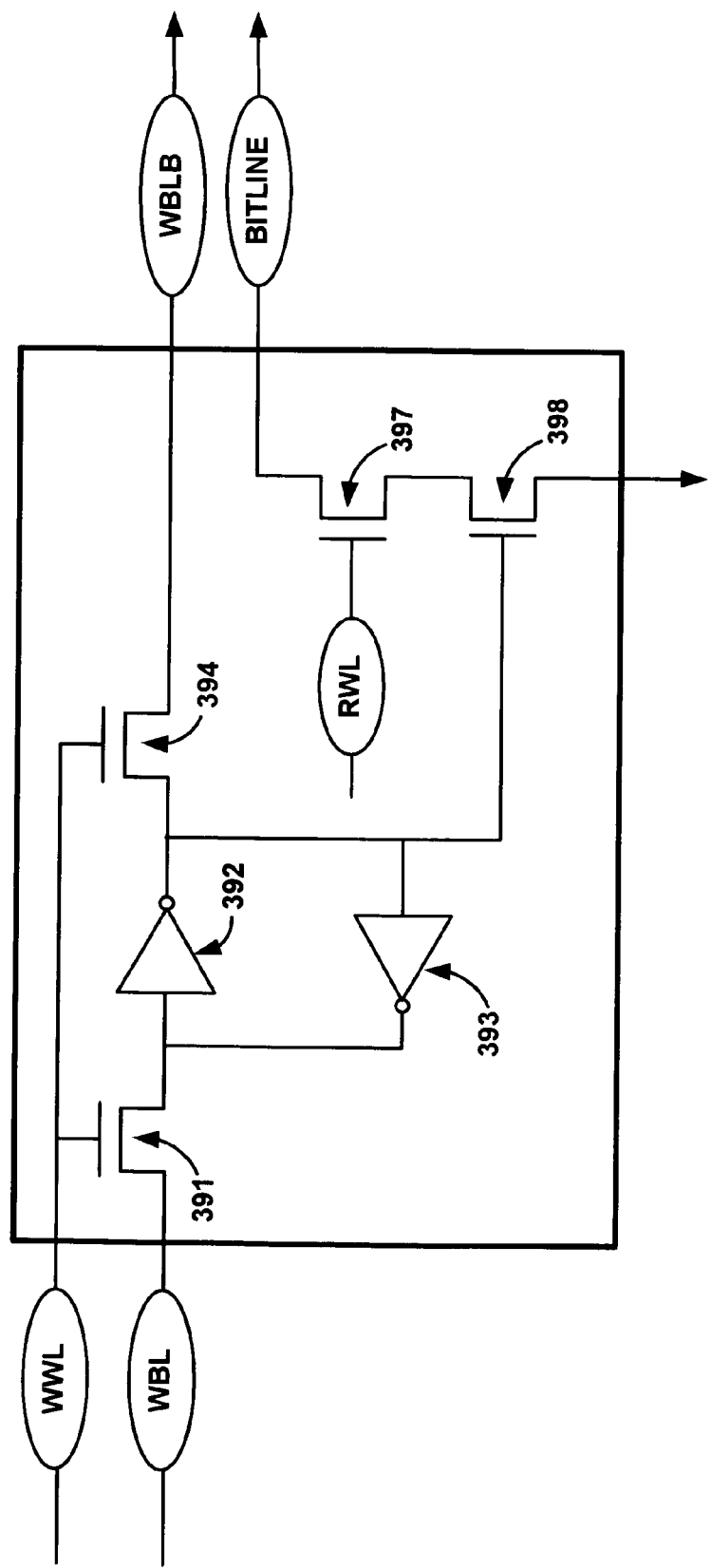
FIG. 3B is an illustration of a exemplary memory cell included in one embodiment of the present invention.

FIG. 3B is an illustration of memory cell 390, one embodiment of a memory cell include in an exemplary implementation of the present invention(e.g., memory cells 320 through 329). Memory cell 390 comprises transistor 391 and 394, inverters 392 and 393, evaluation transistor 397 and data transistor 398. Transistors 391 and 394 provide differential voltage levels on a word bit line (WBL) signal when a word write line (WWL) signal is activated. The differential voltage levels correspond to logical values (e.g., logical 0 or 1) and are applied to inverters 392 and 393 which are utilized to "store" the logic values. Inverters 392 and 393 drive data transistor 398 on to a pull down status if a logical 0 state is stored in inverters 392 and 393. Evaluation transistor 397 is turned on by a read word line (RWL) signal and permits the data transistor 398 to control whether the bitline output signal is pulled down or not.

One cell actively drives the bitline at any time, but the leakage current on the bitline is determined by all of the cells coupled to the bitline. The leakage current of the cells is countered by suspension keeper circuit 310 in the case when the prechared bitline is meant to maintain the precharge logic state after the precharge transistor turns off, and the selected memory cell during evaluation is not pulling the bitline low. If the keeper is not suspended when an intentional operation tries to drive the cell to a logic low state, the cell has to overcome the current of the keeper in order to pull down the bitline. This is true even if the keeper has a simple feedback that shuts off after the bit line evaluates low. The performance loss caused by the keeper grows as the size of the keeper becomes significant with respect to a single cell evaluation transistor. The present invention overcomes these problems by suspending the voltage level maintenance when there is an intentional evaluation transition (e.g. for a brief period of time when a bitline value is intentional altered in a read operation).

In one embodiment of the present invention, a suspension keeper control signal is derived from a precharge signal. For example, a suspension keeper control signal is derived from a precharge signal by delaying a transition in the suspension keeper control signal for a predetermined period after a transition in the precharge signal. The keeper suspension control signal directs the suspension keeper circuit to suspend the keeper operations for a period of time sufficient for an intentional transition to occur in the target signal.

Figure 3C:
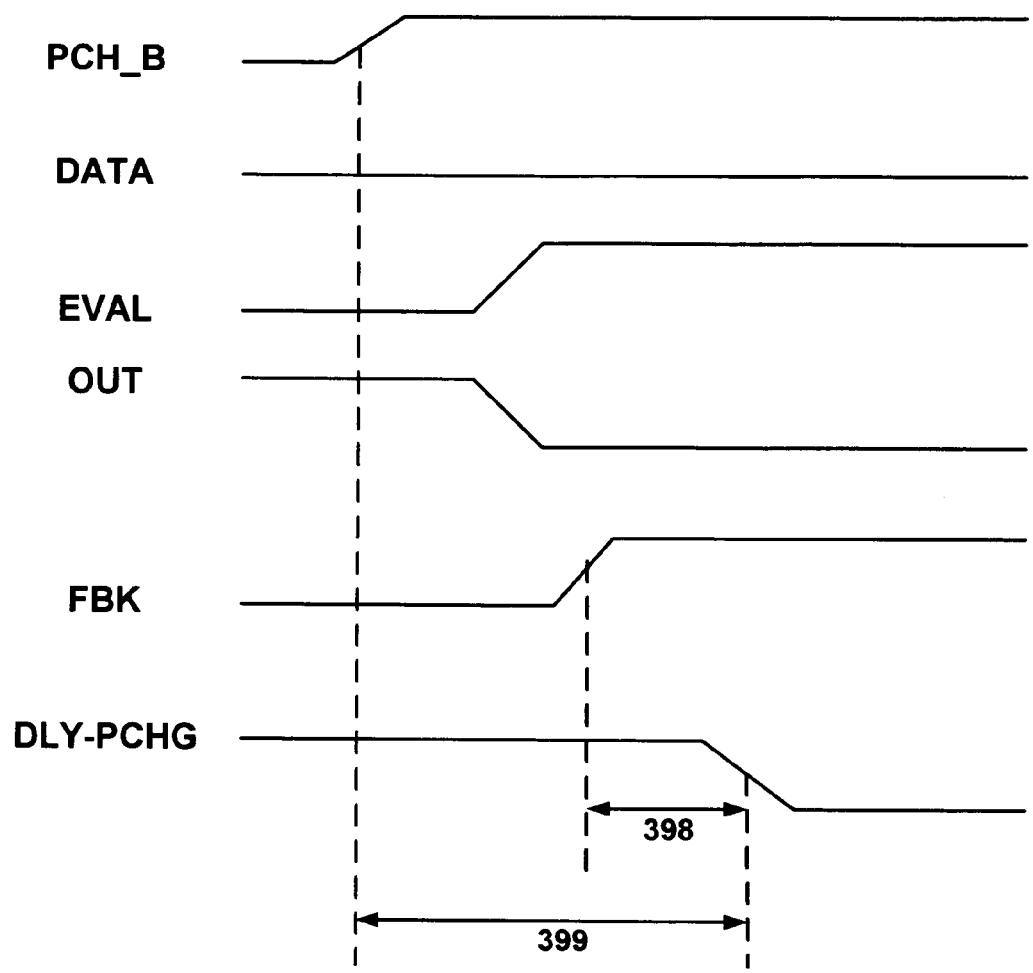
FIG. 3C is an exemplary timing diagram illustrating the relationship of signal transitions in one embodiment of the present invention.

FIG. 3C is an exemplary timing diagram illustrating the relationship of signal transitions in one embodiment of the present invention. In one embodiment, the time 399 from the precharge signal (e.g., PCHG_B) rising to a suspension keeper control signal (e.g., DLYPCHG) falling is greater than time difference 398 between a precharge (e.g., PCHG_B) rising to a bit line feedback signal (e.g., FBK) rising. In one exemplary implementation the feedback signal is the output of inverter 212.

Figure 4:
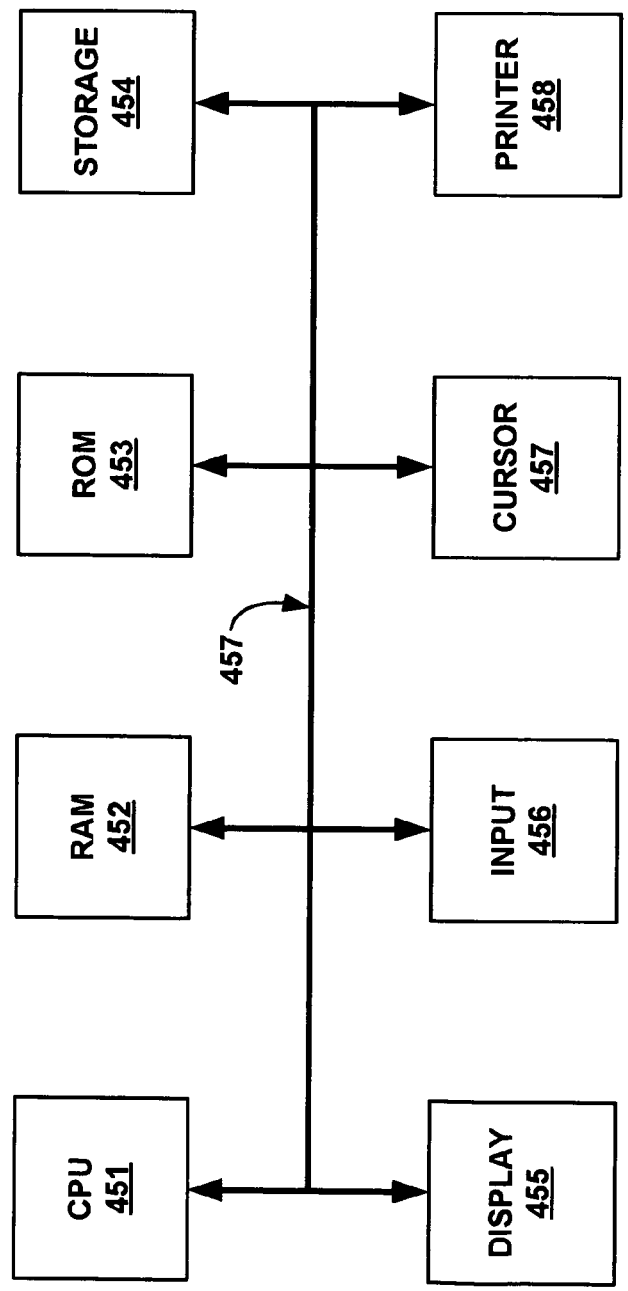
FIG. 4 is a block diagram of one embodiment of a computer system platform utilize to implement a present invention suspension keeper system or method.

FIG. 4 is a block diagram of computer system 450, one embodiment of a platform that is utilize to implement a keeper suspension method or suspension keeper system (e.g., suspension keeper system 100). In general, computer system 450 comprises a bus 457, a central processor 451, a random access memory 452, a read only memory 453, a data storage device 454, a display device 455, an alphanumeric input device 456, a cursor control device 457 and a printer 458. Bus 457 is coupled to central processor 451, random access memory 452, read only memory 453, data storage device 454, display device 455, alphanumeric input device 456, cursor control device 457 and printer 458. The components of computer system 450 comprise a variety of interchangeable embodiments.

The components of computer system 450 cooperatively operate to perform their designated functions. Central processor 451 processes information and instructions. Random access memory 452 stores information and instructions for the central processor 451. Read only memory 453 stores static information and instructions for the processor 451. Data storage device 454 (e.g., such as a magnetic or optical disk and disk drive) provides bulk storage for storing information and instructions. Display device 455 displays information to a computer user. Alphanumeric input device 456 includes alphanumeric and function keys for communicating information and command selections to the central processor 451. Cursor control device 457 communicates user input information and command selections to the central processor 451. Printer 458 prints documents in accordance with directions from central processor 451. Bus 457 is a path for communicating information. In one embodiment, a present invention suspension keeper system (e.g., suspension keeper circuit 210A or 210B) provides voltage level support for output signals of memory cells included in components of computer system 450 (e.g., a central processor 451, a random access memory 452, a read only memory 453) with suspension of the voltage level maintenance or support during intentional transitions in the output signals.

Figure 5:
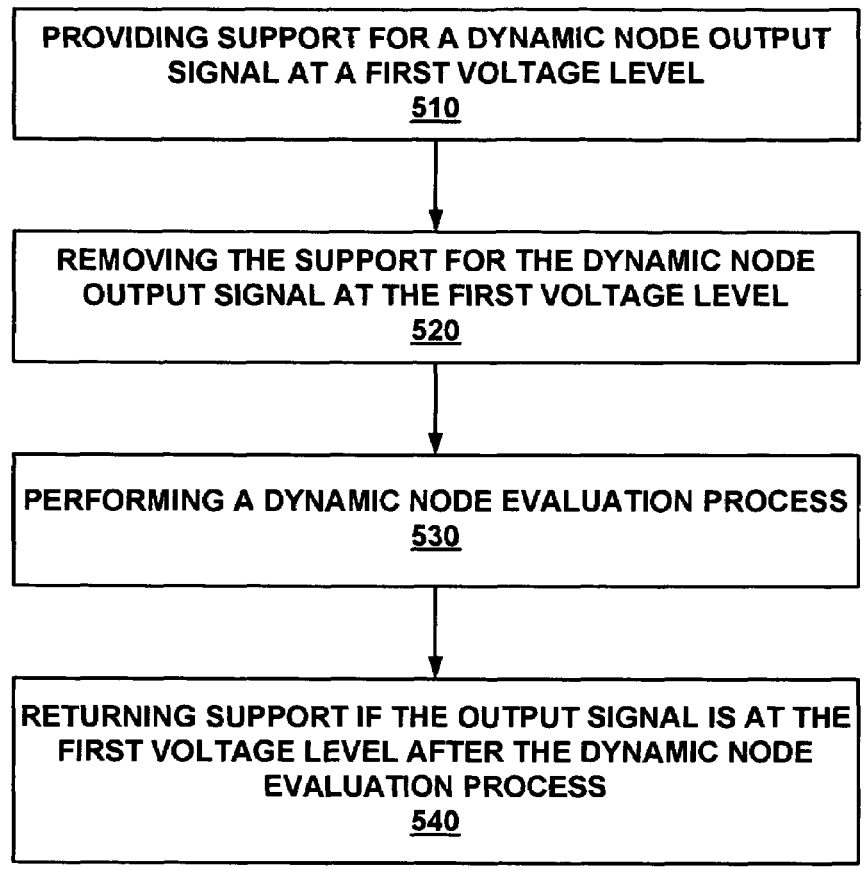
FIG. 5 is a flow chart of a dynamic node suspension keeper method in accordance with one embodiment of the present invention.

FIG. 5 is a flow chart of dynamic node keeper suspension method 500, one embodiment of the present invention. In one embodiment of the present invention, dynamic node keeper suspension method 500 provides voltage level support for an output target signal (e.g., a dynamic node output signal) that "keeps" the output target signal at a particular voltage level with efficient suspension of the voltage level maintenance or support during an evaluation transition period (e.g., a read operation) of the output target signal. In one exemplary implementation of the present invention, the voltage level support facilitates maintenance or support for a voltage level of a memory cell output signal associated with a logic state while permitting suspension of the support during a read operation intentional transition in the memory cell output signal logic state.

In step 510, support is provided for a dynamic node output voltage at a first level. In one embodiment, the dynamic node is a memory cell and the dynamic node output is a bitline. In one exemplary implementation, the support is provided by a voltage level support signal at the first voltage level applied to the bitline via a keeper switch (e.g., keeper switch component 110, keeper switch component 213, etc).

The support is removed for the dynamic node output voltage at the first level is removed in step 520. For example, support is suspended during operational changes to a value of the dynamic node output voltage. In one embodiment of the present invention, the support is removed by blocking a voltage level support signal. For example, by controlling a keeper switch component directly (e.g., with NAND gate 219) or by blocking the output of a keeper switch component (e.g., with transistor 211).

At step 530, a dynamic node evaluation process is performed. For example, during an evaluation transition period (e.g., a read operation) of the output target signal. In one embodiment the dynamic node operation is a read operation to a dynamic node memory cell. In one exemplary implementation of the present invention, an intentional transition in a bitline is made during an evaluation process (e.g., a read operation) and support for the bitline is removed during the intentional transition (e.g., in a memory cell output signal voltage level or logic state).

In step 540, the support is returned if the output voltage is at the first level after the dynamic node evaluation process. In one embodiment the dynamic node output voltage first level is associated with a logical state. For example, if the output voltage is associated with a logical 1 (e.g., a high voltage) the support is returned after a period for intentional transitions in the output voltage during a dynamic node evaluation process.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A suspension keeper system comprising:
a keeper switch component for providing logic state maintenance; and
a keeper switch suspension component for suspending the influence of said keeper switch component selectively during normal operations; said keeper switch suspension component coupled to said keeper switch component.

2. The suspension keeper system of claim 1 wherein said keeper switch suspension component also controls said keeper switch component.

3. The suspension keeper system of claim 1 further comprising a keeper switch control component for controlling the operation of said keeper switch component, said keeper switch control component coupled to said keeper switch component.

4. A suspension keeper system of claim 1 wherein said logic state maintenance is suspended when establishing the evaluation status of a node.

5. A suspension keeper system of claim 1 wherein said logic state maintenance is provided for a target signal.

6. A suspension keeper system of claim 5 wherein said target signal is a bit line signal.

7. A suspension keeper system of claim 6 wherein said logic state maintenance is suspended during operational changes to said target signal voltage level.

8. A suspension keeper system of claim 4 wherein said node is a memory cell for storing information, said memory cell coupled to said keeper switch suspension component.

9. A suspension keeper system of claim 1 further comprising a precharge circuit for providing a precharge signal.

10. A dynamic node keeper suspension method comprising:
supporting a dynamic node output voltage at a first level;
removing said support selectively during normal operations;
performing a dynamic node evaluation process; and
returning said support if said output voltage is at said first level after said dynamic node evaluation process.

11. A dynamic node keeper suspension method of claim 10 wherein said support is suspended during operational changes to a value of said dynamic node output voltage.

12. A dynamic node keeper suspension method of claim 10 wherein said dynamic node is a memory cell.

13. A dynamic node keeper suspension method of claim 12 wherein said dynamic node operation is a read operation to said dynamic node memory cell.

14. A dynamic node keeper suspension method of claim 10 wherein said dynamic node output is a bitline.

15. A dynamic node keeper suspension method of claim 10 wherein said dynamic node output voltage first level is associated with a logical state.

16. A memory array system comprising:
a memory cell for storing a bit of information;
a bit line for providing an indication of the logical value of said bit of information stored in said memory cell; said bit line coupled to said memory cell; and
a suspension keeper circuit for maintaining a fist voltage level of said bit line and selectively suspending said maintenance during said memory cell read operations.

17. A memory array system of claim 16 further comprising a precharge circuit for providing a precharge for said memory cell.

18. A memory array system of claim 16 wherein said suspension keeper circuit comprises:
a keeper switch component for providing voltage level maintenance; and
a keeper switch suspension component for suspending the influence of the keeper circuit; said keeper switch suspension component coupled to said keeper switch component.

19. A memory array system of claim 18 wherein said keeper switch suspension component comprises:
a first transistor that prevents or permits the output of said keeper switch component from influencing said voltage level of said bit line, said transistor coupled to the output of said keeper switch component; and an inverter for controlling a second transistor included in said keeper switch component, said inverter coupled to a control gate of said second transistor.

20. A memory array system of claim 18 wherein said keeper switch suspension component comprises a NAND gate coupled to said keeper switch component, said NAND gate provides control and suspension of said voltage level maintenance.

* * * * *